(12) United States Patent
Liu et al.

(10) Patent No.: US 9,356,583 B2
(45) Date of Patent: May 31, 2016

(54) FLIP-FLOP CIRCUIT

(71) Applicant: TAIWAN SEMICONDUCTOR MANUFACTURING COMPANY LTD., Hsinchu (TW)

(72) Inventors: Chi-Lin Liu, New Taipei (TW); Shang-Chih Hsieh, Taoyuan County (TW); Lee-Chung Lu, Taipei (TW); Chang-Yu Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 8 days.

(21) Appl. No.: 14/472,937

(22) Filed: Aug. 29, 2014

(65) Prior Publication Data

US 2016/0065184 A1   Mar. 3, 2016

(51) Int. Cl.
*H03K 3/012* (2006.01)
*H03K 3/037* (2006.01)

(52) U.S. Cl.
CPC ..................................... *H03K 3/037* (2013.01)

(58) Field of Classification Search
USPC .................. 327/199–202, 215, 219, 225, 228
See application file for complete search history.

(56) References Cited

U.S. PATENT DOCUMENTS

| | | | | |
|---|---|---|---|---|
| 5,459,736 A * | 10/1995 | Nakamura | ..... | G01R 31/318541 324/750.3 |
| 6,938,225 B2 * | 8/2005 | Kundu | ........... | G01R 31/318541 714/727 |
| 7,242,235 B1 * | 7/2007 | Nguyen | ............... | H03K 3/0372 327/210 |

\* cited by examiner

*Primary Examiner* — An Luu
(74) *Attorney, Agent, or Firm* — WPAT, P.C., Intellectual Property Attorneys; Anthony King (57) ABSTRACT

A flip-flop circuit includes a first latch, a trigger stage and a second latch. The first latch is configured to latch a selected signal in response to a first state of a clock signal, and provide a first output signal. The trigger stage receives the clock signal and the first output signal to provide a trigger signal. The trigger signal does not toggle as the clock signal transits. The second latch is configured to latch the trigger signal in response to a second state of the clock signal, and provide a second output signal. The first state and the second state of the clock signal are complementary to each other.

19 Claims, 7 Drawing Sheets

FLIP-FLOP CIRCUIT

BACKGROUND

In silicon-on-chip (SOC) designs, flip-flop circuits such as D-type flip-flops (DFFs) or scan DFFs (SDFFs) are used to perform desired functions of a circuit design. For example, scan chains that comprise a plurality of interconnected scan flip-flops are used to obtain access to internal nodes of an integrated circuit (IC) to simplify testing of the IC by passing test data through the scan flip-flops. The scan flip-flop is configured to operate in one of two modes, data mode and scan mode. When a scan enable signal (assumed active high) of a scan flip-flop is set to a low logical value, the scan flip-flop is in the data mode. When the scan enable signal of the scan flip-flop is set to a high logical value, the scan flip-flop is in scan mode. For a full scan design, during scan testing, all of the flip-flops and all of the combinational logic connected to the flip-flops, may be toggling at the same time, causing relatively high power consumption. This high power consumption may exceed the circuit's power rating as IC chip density and speed increase.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. Any alterations and modifications in the described embodiments, and any further applications of principles described in this document are contemplated as would normally occur to one of ordinary skill in the art to which the disclosure relates. In addition, the present disclosure may repeat reference numerals and/or letters in the various examples. This repetition is for the purpose of simplicity and clarity and does not in itself dictate a relationship between the various embodiments and/or configurations discussed.

It will be understood that when an element is referred to as being "connected to" or "coupled to" another element, it may be directly connected to or coupled to the other element, or intervening elements may be present.

Further, in the below description, a signal is asserted with a high logical value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

Figure 1:
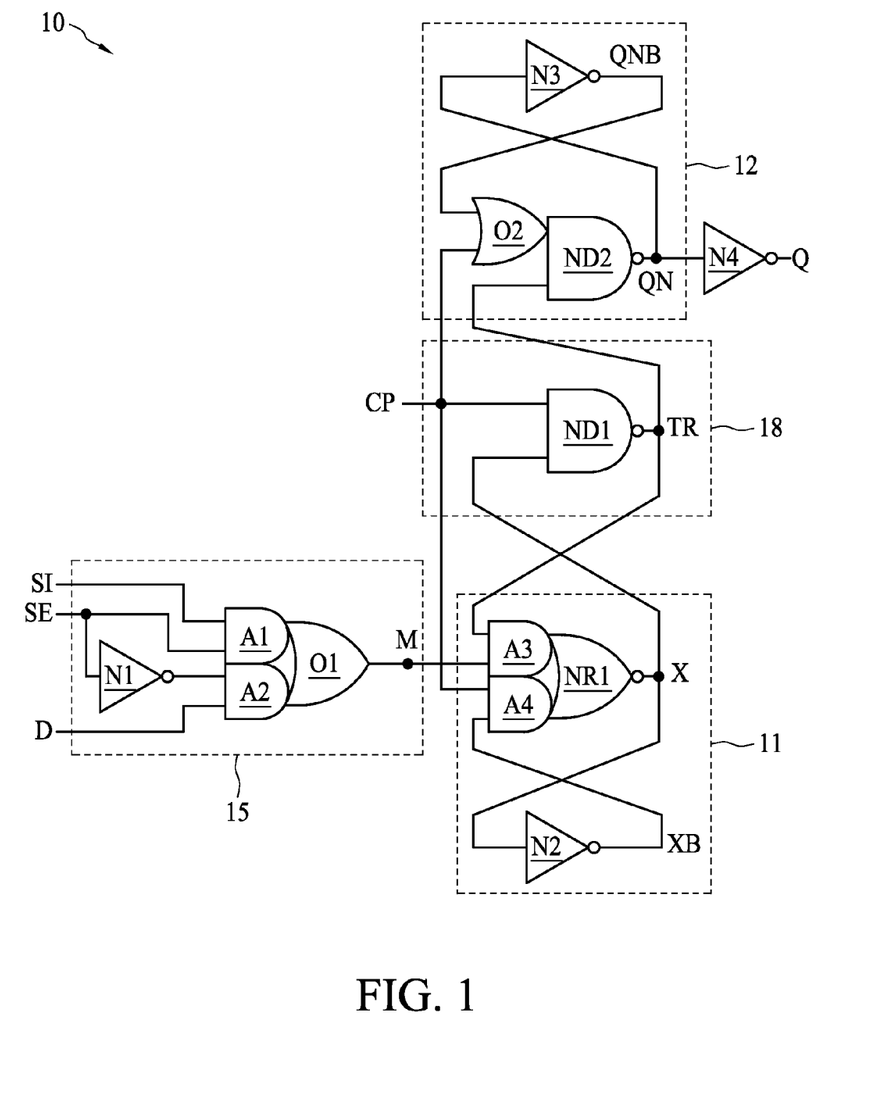
FIG. 1 is a circuit diagram of a flip-flop circuit in accordance with some embodiments.

FIG. 1 is a circuit diagram of a flip-flop circuit 10 in accordance with some embodiments. Referring to FIG. 1, the flip-flop circuit 10 includes an input stage 15, a first latch 11, a second latch 12 and a trigger stage 18. The input stage 15 is configured to select one of inputs for output in response to a mode of operation of the flip-flop circuit 10. The trigger stage 18, connected between the first latch 11 and the second latch 12, is configured to provide a trigger signal TR. The first latch 11 is configured to latch the selected input signal in response to a first state of a clock signal CP, and hold the previously stored value in response to a second state of the clock signal CP. The second latch 12 is configured to hold the previously stored value in response to the first state of the clock signal CP, and latch the trigger signal TR in response to the second state of the clock signal CP.

The input stage 15 selects either a scan input signal SI or a data input signal D as output in response to a scan enable signal SE. A first input of the input stage 15 receives the scan input signal SI. A second input of the input stage 15 receives the scan enable signal SE. A third input of the input stage 15 receives the data input signal D. An output of the input stage 15, at a node M, provides the selected signal SI or D. In an example, the input stage 15 selects the scan input signal SI as output as the scan enable signal SE is enabled, while selects the data input signal D as output as the scan enable signal SE is disabled.

The input stage 15 is formed in a structure composed of logic AND, OR and NOT (inverter) gates. In the present embodiment, the input stage 15 includes an inverter N1, AND gates A1, A2, and a NOR gate O1. A1 includes an input to receive signal SI, and another input to receive signal SE. A2 includes an input to receive signal SI via N1, and another input to receive signal D. O1 includes an input to receive an output from A1, and another input to receive an output from A2. Moreover, O1 provides an output of the input stage 15 at node M.

In operation, signal SE is asserted with a high logical value during a scan mode. In that case, A2 provides a low logical value, irrespective of the logic state of signal D. Meanwhile, the output of O1 depends on signal SI. When signal SI is logically high, the output of O1 is also logically high. When signal SI is logically low, the output of O1 is also logically low. As a result, when signal SE is enabled, signal D becomes irrespective and signal SI is selected as the output of the input stage 15.

On the other hand, signal SE is deasserted with a low logical value during a data mode. In that case, A1 provides a low logical value, irrespective of the logic state of signal SI. Meanwhile, the output of O1 depends on signal D. When signal D is logically high, the output of O1 is also logically high. When signal D is logically low, the output of O1 is also logically low. As a result, when signal SE is disabled, signal SI becomes irrespective and signal D is selected as the output of the input stage 15.

In the present embodiment, with the input stage 15, the flip-flop circuit 10 is able to serve as a scan flip-flop. In other embodiments, however, by entering data input signal D directly at the node M, the input stage 15 may be eliminated and the flip-flop circuit 10 serves as a non-scan flip-flop. As a result, input stage 15 is optional, depending on the applications of the flip-flop circuit 10.

The trigger stage 18 includes a NAND gate ND1. ND1 includes an input to receive clock signal CP, and another input to receive an output X from the first latch 11. Moreover, ND1 includes an output to provide trigger signal TR. As a result, trigger signal TR is pulled up to a high logic state as clock signal CP is logically low (a first logic state of clock signal CP in the present embodiment), irrespective of the logic state of signal X from the first latch 11. As clock signal CP is logically high (a second logic state of clock signal CP in the present embodiment), the logic state of trigger signal TR depends on the logic state of signal X. In that case, when signal X is also logically high, trigger signal TR is pulled low. When signal X is logically low, trigger signal TR is pulled high.

The first latch 11, formed in an AOI structure, includes AND gates A3, A4, a NOR gate NR1 and an inverter N2. A3 includes an input to receive at node M an output from input stage 15, and another input to receive trigger signal TR. A4 includes an input to receive clock signal CP, and another input to receive signal XB, an inverse logic state of signal X by the function of N2. NR1 includes an input to receive an output from A3, and another input to receive an output from A4. Moreover, NR1 includes an output to provide signal X. Since signal X of the first latch 11 serves as an input to the trigger stage 18, while the trigger signal TR of the trigger stage 18 serves as an input to the first latch 11, the first latch 11 and the trigger stage 18 are cross-coupled to each other.

In operation, when clock signal CP is logically low, A4 provides a low logical value, irrespective of the logic state of signal XB. Meanwhile, since trigger signal TR is pulled high due to the logically low clock signal CP, the output signal X of NR1 depends on the output at node M from the input stage 15. When the output at node M is logically high, signal X is logically low. When the output at node M is logically low, signal X is logically high. Accordingly, the output from the input stage 15 is latched at the first latch 11 as signal XB in response to the first state (logically low) of clock signal CP.

On the other hand, when clock signal CP is logically high, the logic state of the previously latched signal X in the first latch 11 determines the logic state of trigger signal TR, as previously discussed. For example, when signal X is logically high, trigger signal TR is pulled low. As a result, A3 provides a low logical value, irrespective of the logic state of the output at node M from the input stage 15. Meanwhile, since signal XB is logically low due to the logically high signal X, A4 also provides a low logical value. By the function of NR1, the previously latched signal X is further enhanced at its high logic state.

Moreover, when clock signal CP is logically high and signal X is logically low, trigger signal TR and signal XB are both pulled high. A4 provides a high logical value due to the logically high input signals CP and XB. By the function of NR1, the previously latched signal X is further enhanced at its low logic state, irrespective of the logic state of the output at node M from the input stage 15. Accordingly, the logic state of the previously latched signal X is held in the first latch 11 in response to the second state (logically high) of clock signal CP.

The second latch 12, formed in an OAI structure, includes an OR gate O2, a NAND gate ND2 and an inverter N3. O2 includes an input to receive clock signal CP, and another input to receive signal QNB, an inverse logic state of signal QN by the function of N3. ND2 includes an input to receive an output from O2, and another input to receive trigger signal TR from the trigger stage 18. Moreover, ND2 includes an output to provide signal QN. The second latch 12 provides an output data Q, an inverse logic state of signal QN, via an inverter N4.

In operation, when clock signal CP is logically low, trigger signal TR is pulled high, irrespective of the logic state of signal X. If the previously latched signal QNB in the second latch 12 is logically high, which means that signal QN is logically low, O2 provides a high logical value. Since the output of O2 and trigger signal TR are both logically high, by the function of ND2, signal QN is further enhanced at its low logic state. Accordingly, the logic state of the previously latched signal QN is held in the second latch 12 in response to the first state of clock signal CP.

On the other hand, when clock signal CP is logically high, O2 provides a high logical value, irrespective of the logic state of signal QNB. Meanwhile, if signal X is logically high and thus trigger signal TR is pulled low, by the function of ND2, signal QN is pulled high. As a result, the second latch 12 provides output data Q having a low logical value. Moreover, if signal X is logically low and thus trigger signal TR is pulled high, by the function of ND2, signal QN is pulled low. Accordingly, trigger signal TR is latched by the second latch 12 as signal QNB. Moreover, the second latch 12 provides output data Q having a high logical value. Since signal X has an inverse logic state of the selected input, SI or D, latched in the first latch 11, and output data Q has an inverse state of signal X, the second latch 12 thus outputs the selected input in response to the second state of clock signal CP.

As a result, the input stage 15 selects one of scan input signal SI and data input signal D for output in response to scan enable signal SE. The first latch 11, coupled to the input stage 15, latches the selected input signal in response to the first state of clock signal CP, and holds the previously latched signal in response to the second state of clock signal CP. Moreover, the first latch 11 provides signal X as output, which has an inverse logic state of the selected signal. The trigger stage 18 provides trigger signal TR, which is irrespective of the state of signal X in response to the first state of clock signal CP, and is determined by the signal X in response to the second state of clock signal CP. Trigger signal TR triggers a latch operation in the first latch 11 in response to the first state of clock signal CP, and triggers a latch operation in the second latch 12 in response to the second state of clock signal CP. The second latch 12 holds the previously latched signal in response to the first state of clock signal CP, and latches trigger signal TR in response to the second state of clock signal CP. Operation of flip-flop circuit 10 is summarized in Table 1 below.

TABLE 1

| CP | TR | XB (or $\overline{X}$) | QNB (or Q) |
|---|---|---|---|
| 0 | 1 | D or SI (latch) | the previously stored value (hold) |
| 1 | $\overline{X}$ (D or SI) | the previously stored value (hold) | TR (latch) |

In some existing approaches, transmission gates (TGs) are used in flip-flop circuits. However, local buffers may be required to provide both inverted (CLK) and restored (CLKB) phases of a clock signal to those transmission gates. Such local buffers, which serve as two-phase switches, are toggled during every clock transition, and thus result in inefficient power management. Unlike the above-mentioned TG-type approaches, the flip-flop circuit 10 according to the present disclosure is established in an AOI or OAI structure free from transmission gates. Simulation results reveal that the AOI-type flip-flop circuit 10 is approximately 35% less power consumed than the TG-type flip-flop circuits. Moreover, unlike the above-mentioned two-phase triggering scheme, one-phase triggering is employed in the flip-flop circuit 10. Effectively, flip-flop circuit 10 can achieve a relatively simple and efficient way of circuit operation, as compared to the existing two-phase triggering schemes.

Figure 2:
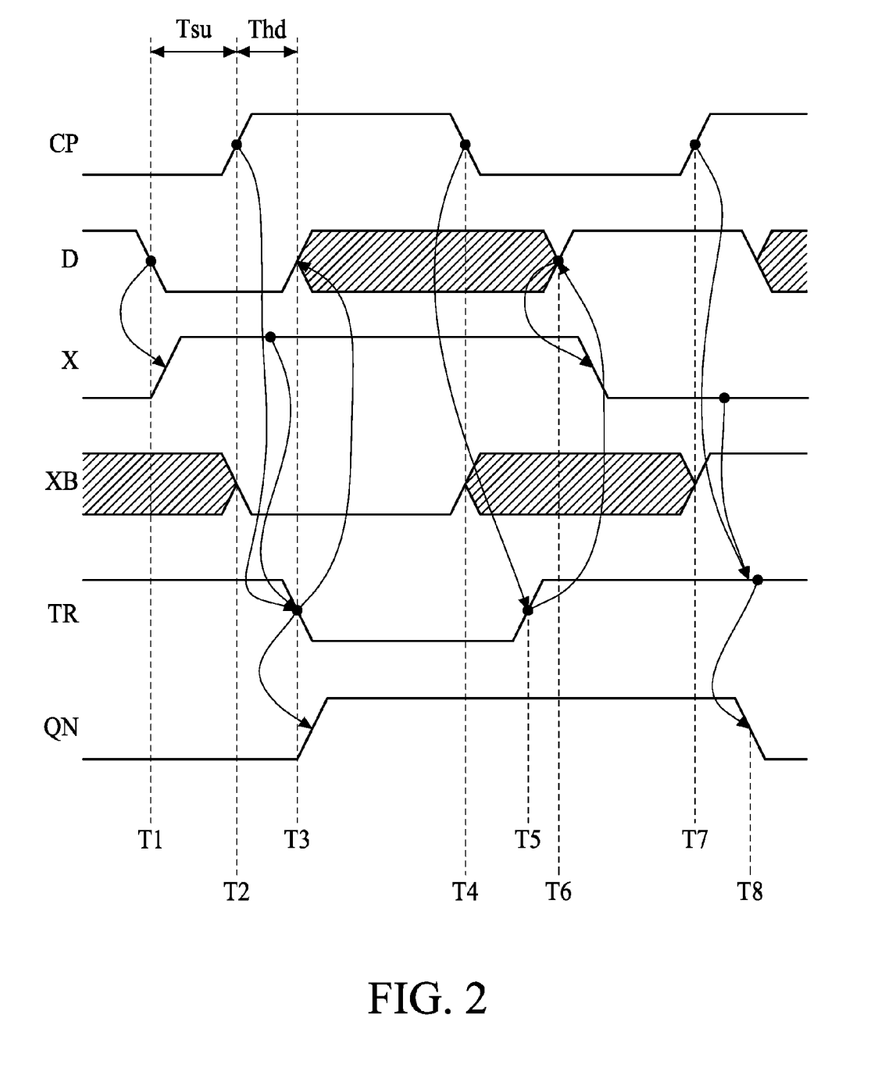
FIG. 2 is a timing diagram illustrating signals during a data mode operation of the flip-flop circuit in FIG. 1 in accordance with some embodiments.

FIG. 2 is a timing diagram illustrating signals during a data-mode operation of the flip-flop circuit 10 illustrated in FIG. 1, in accordance with some embodiments. Although data-mode operation is shown, as self-evident from the previous discussion with respect to flip-flop circuit 10, scan-mode operation also falls within the contemplated scope of the present disclosure.

Referring to FIG. 2 and also to FIG. 1, at time T1, clock signal CP is low and trigger signal TR is kept logically high due to the first state of clock signal CP, irrespective of the state of signal X. The output of first latch 11, signal X, is based on trigger signal TR, data signal D, clock signal CP and signal XB. Since clock signal CP is low so that signal XB becomes irrespective, and further since trigger signal TR is high, signal X depends on data signal D at node M. Assuming that data signal D received at first latch 11 falls, signal X is caused to be pulled high at time T1. Moreover, signal QN is kept at a currently stored value, assumed low.

After a set-up time Tsu (a period required for data signal D to become stable before clock signal CP rises), at time T2, clock signal CP rises. Moreover, signal X is already pulled high, and signal XB is pulled low due to the logically high signal X. Trigger signal TR, based on clock signal CP and signal X, is caused to be pulled low at time T2.

Subsequently, after a hold time Thd (a period required for holding data signal D after clock signal CP rises), at time T3, trigger signal TR is pulled low due to the logically high signals CP and X. Meanwhile, with signals TR and XB pulled low, signal X is held at the previously stored value (logically high), irrespective of the state of data signal D. Furthermore, with signal TR pulled low, signal QN is pulled high later.

Next, at time T4, clock signal CP falls. Meanwhile, signal XB in front of AND gate A4 becomes irrespective.

After clock signal CP has been low for long enough, at time T5, trigger signal TR is pulled high, irrespective of the state of signal X.

With clock signal CP logically low and trigger signal TR pulled high, the state of signal X depends on data signal D at node M. Assuming that data signal D is logically high at time T6, signal X is pulled low later. Moreover, with clock signal CP logically low and trigger signal TR pulled high, signal QN is kept at the previously stored value, logically high.

As a result, in response to the first state (logically low) of clock signal CP, trigger signal TR is pulled high, irrespective of the state of signal X. Data signal D received in the current cycle is latched at first latch 11, and data signal received in the previous cycle is held at second latch 12 and output via inverter N4 as output data Q.

At time T7, clock signal CP rises. Signal XB is pulled high due to the logically low signal X. After clock signal CP has been high for long enough, with signal X logically low, trigger signal TR is pulled high. Referring back to time T3, when signal X is logically high, trigger signal TR is pulled low. Accordingly, trigger signal TR represents an inverse state of signal X. Moreover, with signals CP and XB logically high, signal X is kept at the currently stored value (logically low), irrespective of the state of data signal D. Furthermore, with clock signal logically high and trigger signal pulled low, signal QN is pulled low at time T8.

As a result, in response to the second state (logically high) of clock signal CP, signal X is held at the previously stored value at first latch 11, irrespective of the state of data signal D. Moreover, trigger signal TR is latched at second latch 12 and output via inverter N4 as output data Q.

Figure 3:
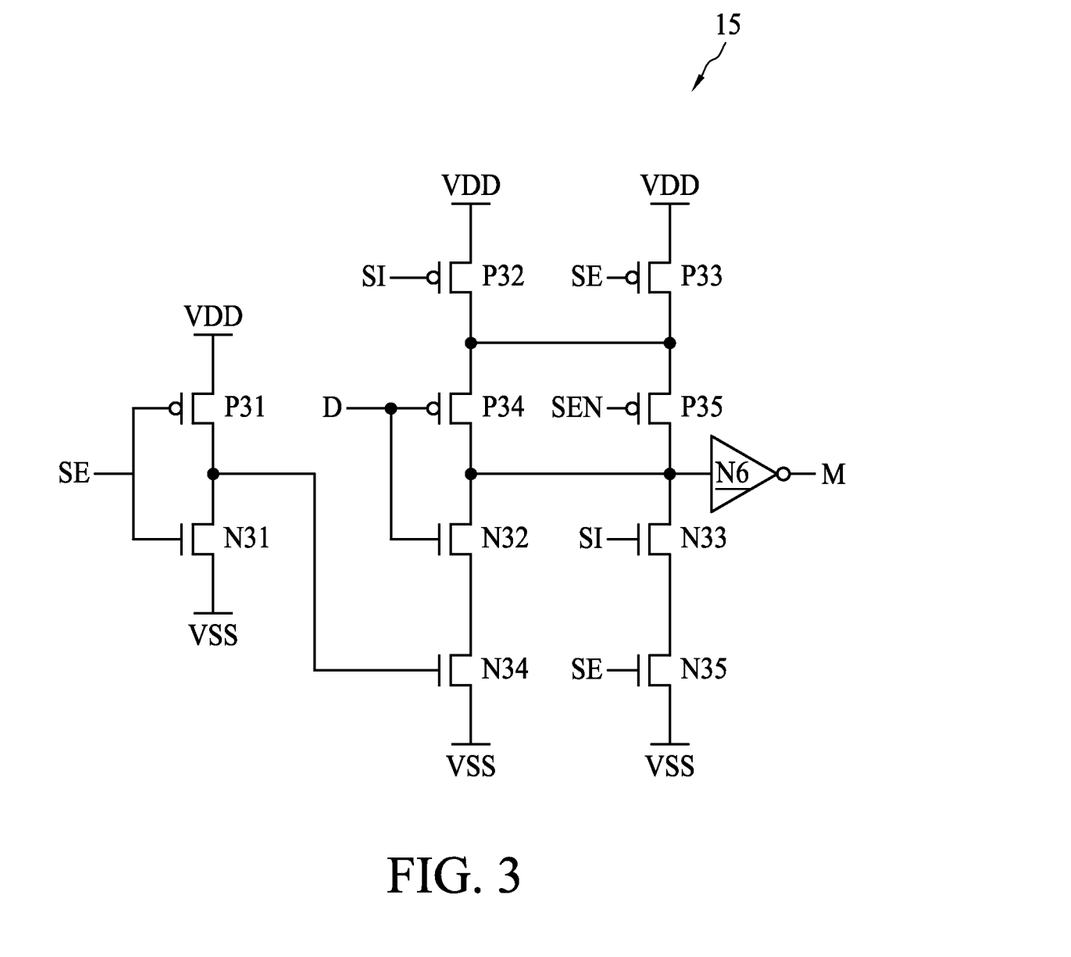
FIG. 3 is a circuit diagram of an input stage of the flip-flop circuit in FIG. 1 in accordance with some embodiments.

FIG. 3 is a circuit diagram of the input stage 15 of the flip-flop circuit 10 in FIG. 1, in accordance with some embodiments. Referring to FIG. 3, input stage 15 includes p-type metal-oxide-semiconductor (PMOS) transistors P31 to P35, n-type metal-oxide-semiconductor (NMOS) transistors N31 to N35, and an inverter N6. Transistors P31 and N31 form a complementary metal-oxide-semiconductor (CMOS) inverter. Inverter N6, although shown in logic gate, can also take the form of a CMOS inverter in implementation.

In operation, when scan enable signal SE is logically high, transistors P31 and P33 are turned off, while transistors N31, N35 and P35 are turned on. As transistor N31 is turned on, transistor N34 is biased at VSS and thus is turned off, causing the source terminal of transistor N32 floating. Accordingly, when scan input signal SI is logically low, transistor P32 is turned on and transistor N33 is turned off. Since transistors P32 and P35 are turned on, VDD is provided via transistors P32 and P35 towards an input of inverter N6. N6 provides a low logical value as output.

Moreover, when scan input signal SI is logically high, transistor P32 is turned off and transistor N33 is turned on. Since transistors N33 and N35 are turned on, the input of inverter N6 is connected via transistors N33 and N35 towards VSS. N6 provides a high logical value as output. As a result, in response to the logically high scan enable signal SE, scan input signal SI is selected for output at node M, irrespective of the state of data input signal D.

On the other hand, when scan enable signal SE is logically low, transistors P31 and P33 are turned on, while transistors N31, N35 and P35 are turned off. As transistor P31 is turned on, transistor N34 is biased at VDD and thus is turned on. In addition, since transistor N35 is turned off, the source terminal of transistor N33 is floating. Accordingly, when data input signal D is logically low, transistor P34 is turned on and transistor N32 is turned off. Since transistors P34 and P33 are turned on, VDD is provided via transistors P33 and P34 towards the input of inverter N6. N6 provides a low logical value as output.

Moreover, when data input signal D is logically high, transistor P34 is turned off and transistor N32 is turned on. Since transistors N32 and N34 are turned on, the input of inverter N6 is connected via transistors N32 and N34 towards VSS. N6 provides a high logical value as output. As a result, in response to the logically low scan enable signal SE, data input signal D is selected for output at node M, irrespective of the state of scan input signal SI.

Accordingly, input stage 15 of flip-flop circuit 10 can be manufactured in CMOS process. In addition, first latch 11, trigger stage 18 and second latch 12 can also be manufactured in CMOS process. Moreover, no transmission gates and buffers are used in input stage 15, which helps reduce the number of toggling devices required for flip-flop circuit 10.

Figure 4:
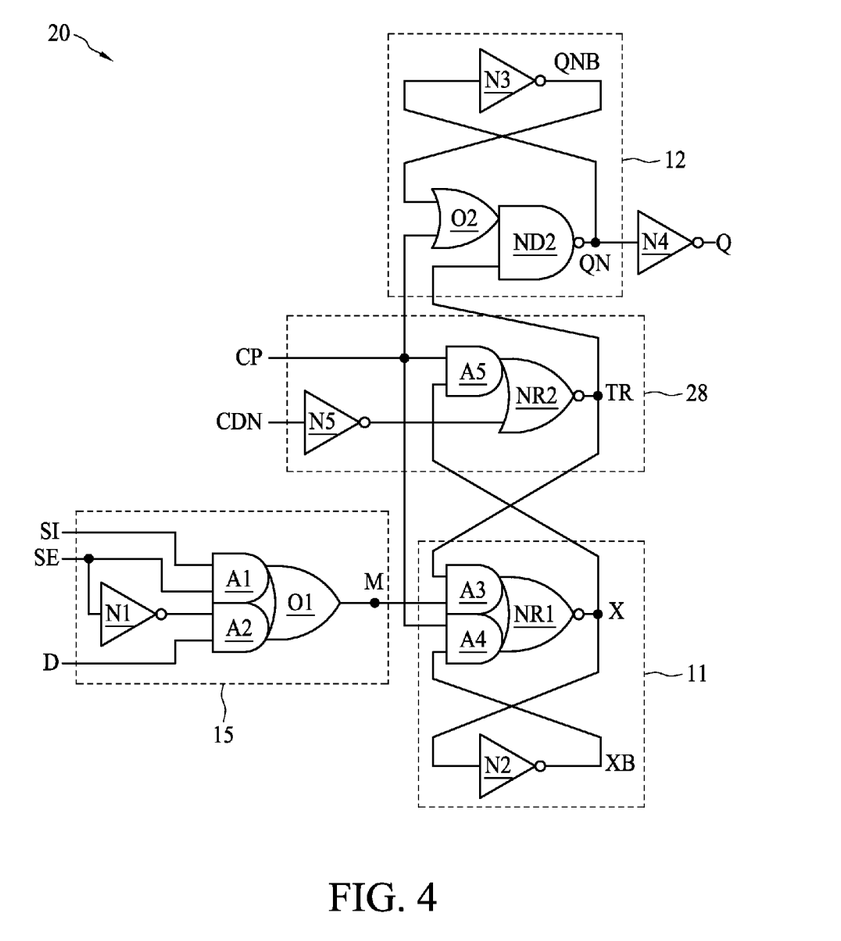
FIG. 4 is a circuit diagram of a flip-flop circuit in accordance with some embodiments.

FIG. 4 is a circuit diagram of a flip-flop circuit 20 in accordance with some embodiments. Referring to FIG. 4, flip-flop circuit 20 is similar to flip-flop circuit 10 described and illustrated with reference to FIG. 1 except, for example, a trigger stage 28. Trigger stage 28, formed in an AOI structure, includes an AND gate A5, a NOR gate NR2 and an inverter N5. A5 includes an input to receive clock signal CP, and another input to receive signal X. NR2 includes an input to receive an output from A5, and another input to receive a controlled signal CDN via N5. Moreover, NR2 provides trigger signal TR at an output.

In operation, when controlled signal CDN is logically high, A5 and NR2 are equivalent to a NAND gate. As a result, trigger stage 28 has the same function as trigger 18 described and illustrated with reference to FIG. 1. When controlled signal CDN is logically low, by the function of N5 and NR2, trigger signal is pulled low, irrespective of the state of clock signal CP and the state of signal X. Moreover, by the function of ND2 and N4, the logically low trigger signal TR pulls low output data Q. Accordingly, in response to the logically high controlled signal CDN, flip-flop circuit 20 operates in normal mode, and in response to the logically low controlled signal CDN, flip-flop circuit 20 operates in clear mode, forcing output data Q to logically low.

Referring back to FIG. 1, when flip-flop circuit 10 operates in data mode, for example, it is likely that data input signal D and output data Q are held logically low for a relatively long time. In that case, operation of flip-flop circuit 10 is summarized in Table 2 below.

TABLE 2

| CP | TR | XB (or $\overline{X}$) | QNB (or Q) |
| --- | --- | --- | --- |
| 0 | 1 | 0 (D = 0) | 0 (the previously stored Q = 0) |
| 1 | 0 (X = 1 and CP = 1) | 0 (the previously stored D = 0) | 0 (TR = 0) |

Table 2 reveals that trigger signal TR toggles with transition of clock signal CP. Nevertheless, output data Q is still held logically low irrespective of the toggling of trigger signal TR. It may thus be desirable to further enhance power management in flip-flop circuit 10.

Figure 5:
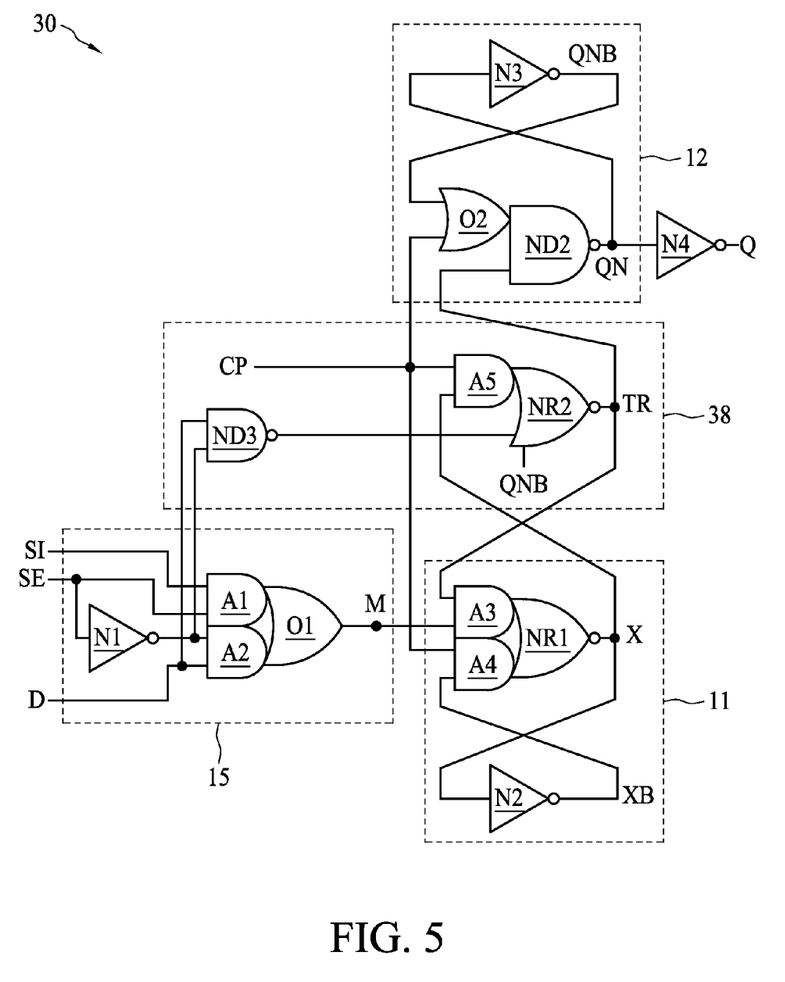
FIG. 5 is a circuit diagram of a flip-flop circuit in accordance with some embodiments.

FIG. 5 is a circuit diagram of a flip-flop circuit 30 in accordance with some embodiments. Referring to FIG. 5, flip-flop circuit 30 is similar to flip-flop circuit 20 described and illustrated with reference to FIG. 4 except, for example, a trigger stage 38. Trigger stage 38, formed in an AOI structure, includes A5, NR2 and a NAND gate ND3. A5 includes an input to receive clock signal CP, and another input to receive signal X. ND3 includes an input to receive data input signal D, and another input to receive scan enable signal SE via N1. NR2 includes an input to receive an output from A5, and another input to receive an output from ND3. NR2 provides trigger signal TR at an output. Moreover, signal QNB at second latch 12 is connected to NR2 at trigger stage 38. As will be discussed with reference to FIG. 6, signal QNB serves as a reference signal to facilitate power management.

Figure 6:
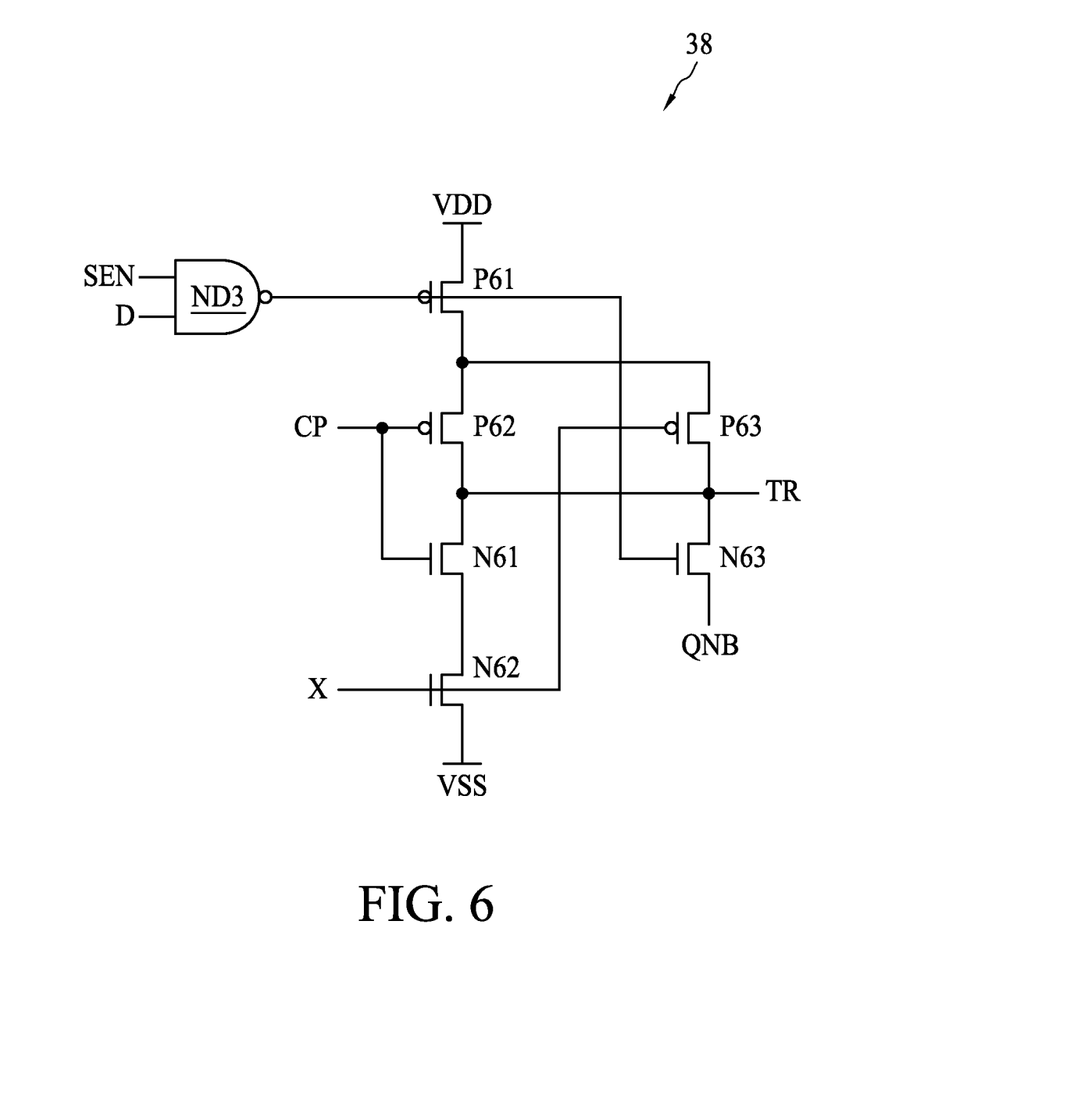
FIG. 6 is a circuit diagram of a trigger device of the flip-flop circuit in FIG. 5 in accordance with some embodiments.

FIG. 6 is a circuit diagram of trigger device 38 of flip-flop circuit 30 in FIG. 5, in accordance with some embodiments. Referring to FIG. 6, in addition to ND3, trigger device 38 includes PMOS transistors P61 to P63 and NMOS transistors N61 to N63. In the present embodiment, signal QNB is connected to a source terminal of transistor N63. In another embodiment, output data Q is connected to a source terminal of transistor N63. In still another embodiment, signal QN is connected to the source terminal of transistor N63 via an inverter.

In operation, when scan enable signal SE is logically low (inverse scan enable signal SEN is logically high), flip-flop circuit 30 operates in data mode and selects data input signal D as output. If data input signal D is logically high, ND3 provides a low logical value, causing transistor P61 to turn on and transistor N63 to turn off. As a result, also referring to FIG. 5, A5 and NR2 in that case are equivalent to a NAND gate. Consequently, trigger stage 38 has the same function as trigger stage 18 described and illustrated with reference to FIG. 1 when data input signal D is logically high.

If data input signal D and output data Q are logically low, ND3 provides a high logical value, causing transistor P61 to turn off and transistor N63 to turn on. As transistor N63 is turned on, trigger signal TR is pulled to QNB, logically low, irrespective of the state of clock signal CP and signal X. Accordingly, when data input signal D and output data Q are held logically low for long enough so that, for example, the previously stored data input signal is also logically low, trigger signal TR is forced to a low logical value and is inhibited from toggling. Since trigger signal TR does not toggle as clock signal CP transits, a relatively efficient power management can be achieved. Simulation results reveal that flip-flop circuit 30 is approximately 58% less power consumed than TG-type flip-flop circuits, though at the expense of area cost.

Although data-mode operation is shown, as obvious from the previous discussion, scan-mode operation also falls within the contemplated scope of the present disclosure. For example, in some embodiments, instead of receiving signal D and SEN as inputs, ND3 in flip-flop circuit 30 may receive signals SI and SE as inputs. As a result, when scan input signal SI and output data Q are held logically low for long enough so that, for example, the previously stored scan input signal is also logically low, trigger signal TR is forced to a low logical value.

Figure 7:
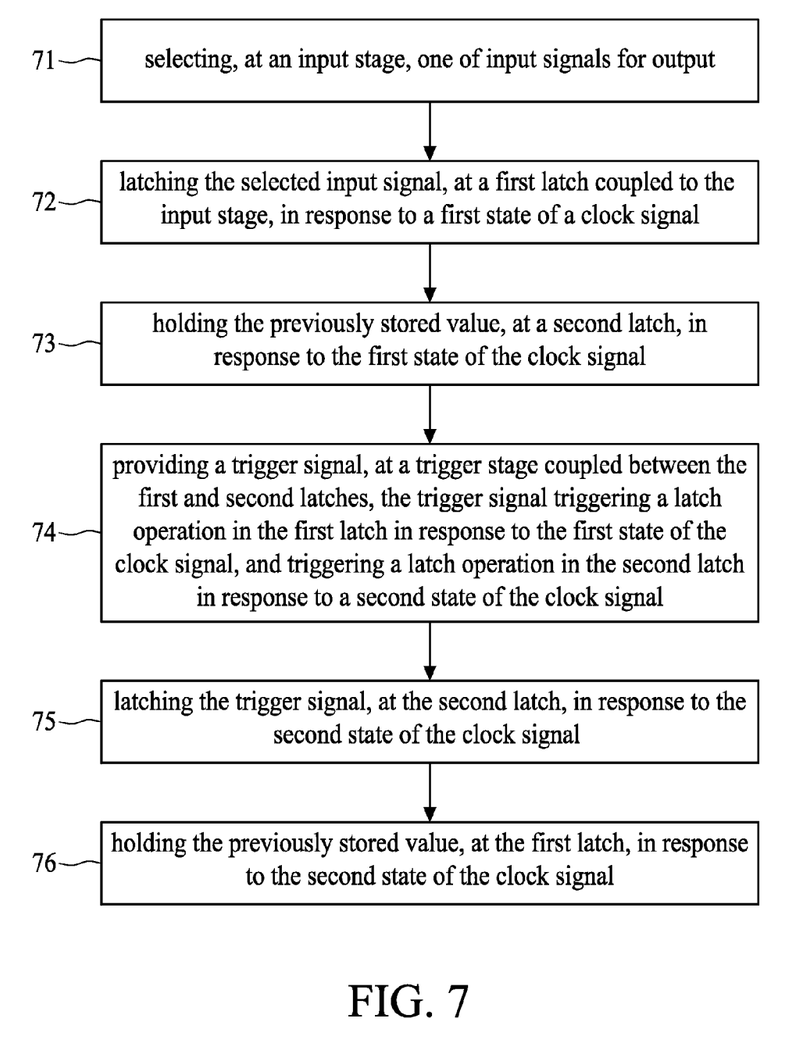
FIG. 7 is a flow diagram of a method of operating a flip-flop circuit in accordance with some embodiments.

FIG. 7 is a flow diagram of a method of operating a flip-flop circuit in accordance with some embodiments. Referring to FIG. 7, in operation 71, one of input signals SI and D is selected at an input stage 15.

Next, in operation 72, the selected input signal SI or D is latched, at a first latch 11 coupled to the input stage 15, in response to a first state of a clock signal CP.

In operation 73, the previously stored value (of output data Q) is held, at a second latch 12, in response to the first state of the clock signal CP. Operation 72 and operation 73 are interchangeable because they are performed in response to the first state of the clock signal CP in a same clock cycle.

In operation 74, a trigger signal TR is provided, at a trigger stage 18, 28 or 38 coupled between the first latch 11 and the second latch 12. The trigger signal TR triggers a latch operation in the first latch 11 in response to the first state of the clock signal CP, and triggers a latch operation in the second latch 12 in response to a second state of the clock signal CP. The first state and the second state of the clock signal CP are complementary to each other.

Next, in operation 75, the trigger signal TR is latched, at the second latch 12, in response to the second state of the clock signal CP.

In operation 76, the previously stored value (of SI or D) is held, at the first latch 11, in response to the second state of the clock signal CP. Operation 75 and operation 76 are interchangeable because they are performed in response to the second state of the clock signal CP in a same clock cycle.

In some embodiments, a controlled signal CDN is provided via the trigger stage 28 to clear or reset the output data Q.

In some embodiments, the trigger signal TR is forced not to toggle when the selected input signal SI or D and the output data Q are held logically low.

In some embodiments, a flip-flop circuit is provided. The flip-flop circuit includes a first latch, a trigger stage and a second latch. The first latch is configured to latch a selected signal in response to a first state of a clock signal, and provide a first output signal. The trigger stage, connected to the first latch, is configured to provide a trigger signal based on the clock signal and the first output signal. The second latch, connected to the trigger stage, is configured to latch the trigger signal in response to a second state of the clock signal, and provide a second output signal. The first state and the second state of the clock signal are complementary to each other.

In still some embodiments, a flip-flop circuit is provided. The flip-flop circuit includes an input stage, a first latch and a second latch. The input stage is configured to select one of input signals for output. The first latch is configured to latch the selected signal in response to a first state of a clock signal in a clock cycle, and hold the previously latched selected signal in response to a second state of the clock signal in the clock cycle. The first state and the second state of the clock signal are complementary to each other. The second latch is configured to latch the selected signal in response to the second state of the clock signal in the clock cycle, and hold the previously latched selected signal latched in the previous clock cycle.

In some embodiments, a method of operating a flip-flop circuit is provided. The method includes selecting, at an input stage, one of input signals for output; latching the selected input signal, at a first latch connected to the input stage, in response to a first state of a clock signal; providing a trigger signal, at a trigger stage connected to the first latch, based on the clock signal and an output signal from the first latch; and latching the trigger signal, at a second latch connected to the trigger stage, in response to a second state of the clock signal. The first state and the second state of the clock signal are complementary to each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-flop circuit, comprising:
    a first latch configured to latch a selected signal in response to a first state of a clock signal and provide a first output signal;
    a trigger stage, connected to the first latch, configured to provide a trigger signal based on the clock signal and the first output signal; and
    a second latch, connected to the trigger stage, configured to latch the trigger signal in response to a second state of the clock signal and provide a second output signal, the first state and the second state of the clock signal being complementary to each other.

2. The circuit of claim 1, wherein the trigger stage is configured to receive a controlled signal to clear the second output signal.

3. The circuit of claim 1, wherein the trigger stage is configured to receive a controlled signal to inhibit the trigger signal from toggling.

4. The circuit of claim 1, wherein the first latch is configured to hold the previously latched selected signal in response to the second state of the clock signal, and the second latch is configured to hold the previously latched trigger signal in response to the first state of the clock signal.

5. The circuit of claim 1 further comprising:
    an input stage, connected to the first latch, configured to select one of input signals as the selected signal.

6. The circuit of claim 5, wherein the input stage, first latch, trigger stage and second stage are formed in an AOI structure composed of logic AND gates, OR gates and inverters.

7. The circuit of claim 5, wherein the input stage includes:
    a first AND gate to receive a scan input signal;
    a second AND gate to receive a data input signal; and
    an OR gate to provide one of the scan input signal and the data input signal as the selected signal.

8. The circuit of claim 1, wherein the first latch includes:
    a first AND gate to receive the selected signal and the trigger signal;
    a second AND gate to receive the clock signal; and
    a NOR gate to receive an output each from the first AND gate and the second AND gate, and provide the first output signal.

9. The circuit of claim 1, wherein the trigger stage includes:
    a NAND gate to receive the clock signal and the first output signal, and provide the trigger signal.

10. The circuit of claim 1, wherein the trigger stage includes:
    a NOR gate to receive a controlled signal for clearing the second output signal.

11. The circuit of claim 1, wherein the trigger stage includes:
    a NAND gate to receive one of a scan input signal and a data input signal; and
    a NOR gate to receive an output from the NAND gate for inhibiting the trigger signal from toggling.

12. The circuit of claim 1, wherein the second includes:
    an OR gate to receive the clock signal; and
    a NAND gate to receive an output from the OR gate and the trigger signal.

13. A flip-flop circuit, comprising:
    an input stage configured to select one of input signals for output;
    a first latch configured to latch the selected signal in response to a first state of a clock signal in a clock cycle, and hold the previously latched selected signal in response to a second state of the clock signal in the clock cycle, the first state and the second state of the clock signal being complementary to each other;
    a second latch configured to latch the selected signal in response to the second state of the clock signal in the clock cycle, and hold the previously latched selected signal latched in the previous clock cycle; and
    a trigger stage connected between the first latch and the second latch, wherein the trigger stage is configured to provide a trigger signal based on the clock signal and an output signal from the first latch.

14. The circuit of claim 13, wherein the trigger stage is configured to receive a controlled signal to clear an output signal at the second latch.

15. The circuit of claim 13, wherein the trigger stage is configured to receive a controlled signal to inhibit the trigger signal from toggling.

16. A method of operating a flip-flop circuit, the method comprising:
    selecting, at an input stage, one of input signals for output;
    latching the selected input signal, at a first latch connected to the input stage, in response to a first state of a clock signal;
    providing a trigger signal, at a trigger stage connected to the first latch, based on the clock signal and an output signal from the first latch; and
    latching the trigger signal, at a second latch connected to the trigger stage, in response to a second state of the clock signal, the first state and the second state of the clock signal being complementary to each other.

17. The method of claim 16 further comprising:

providing a controlled signal to the trigger stage, the controlled signal causing the trigger signal to change to a predetermined state; and clearing an output from the second latch, based on the trigger signal having the predetermined state.

18. The method of claim 16 further comprising:

providing a controlled signal in response to a predetermined state of the selected signal; and inhibiting the trigger signal from toggling, based on the controlled signal.

19. The method of claim 16 further comprising:

holding the previously latched selected signal, at the first latch, in response to the second state of the clock signal; and holding the previously latched trigger signal, at the second latch, in response to the first state of the clock signal.

* * * * *